US010050035B2

(12) United States Patent
Cheng et al.

(10) Patent No.: US 10,050,035 B2
(45) Date of Patent: Aug. 14, 2018

(54) METHOD OF MAKING PROTECTIVE LAYER OVER POLYSILICON STRUCTURE

(71) Applicant: TAIWAN SEMICONDUCTOR MANUFACTURING COMPANY, LTD., Hsinchu (TW)

(72) Inventors: Yu-Shao Cheng, Taipei (TW); Shin-Yeu Tsai, Zhubei (TW); Chui-Ya Peng, Hsinchu (TW); Kung-Wei Lee, New Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 162 days.

(21) Appl. No.: 14/158,239

(22) Filed: Jan. 17, 2014

(65) Prior Publication Data

US 2015/0206879 A1     Jul. 23, 2015

(51) Int. Cl.
*H01L 27/092* (2006.01)
*H01L 21/311* (2006.01)
(Continued)

(52) U.S. Cl.
CPC ........ *H01L 27/092* (2013.01); *H01L 21/0228* (2013.01); *H01L 21/02164* (2013.01); *H01L 21/28247* (2013.01); *H01L 21/31111* (2013.01); *H01L 21/31116* (2013.01); *H01L 21/32051* (2013.01); *H01L 21/32055* (2013.01); *H01L 21/8222* (2013.01); *H01L 21/8238* (2013.01);
(Continued)

(58) Field of Classification Search
CPC ......... H01L 21/01027; H01L 21/76834; H01L 21/823468; H01L 29/6656; H01L 27/10894; H01L 21/823864; H01L 27/092; C23C 16/402; C23C 16/45542
See application file for complete search history.

(56) References Cited

U.S. PATENT DOCUMENTS 4,577,390 A * 3/1986 Haken ................ H01L 21/3145
257/371
4,961,820 A * 10/1990 Shinagawa ....... H01L 21/31138
134/1.2
(Continued)

OTHER PUBLICATIONS

Dhong et al. "Sidewall Spacer Technology for MOS and Bipolar Devices" J. Electrochem. Soc. 1986 vol. 133, issue 2, 389-396, p. 394.*

*Primary Examiner* — Tom Thomas
*Assistant Examiner* — John Bodnar
(74) *Attorney, Agent, or Firm* — Hauptman Ham, LLP

(57) ABSTRACT

A method includes forming a first polysilicon structure over a first portion of a substrate. A second polysilicon structure is formed over a second portion of the substrate. Two spacers are formed on opposite sidewalls of the second polysilicon structure. A layer of protective material is formed to cover the first and second portions of the substrate. The layer of protective material has a first thickness over the second polysilicon structure and a second thickness over the two spacers. The first thickness is equal to or greater than 500 Å, and the second thickness is equal to or less than 110% of the first thickness. A patterned photo resist layer is formed to cover a first portion of the layer of protective material that covers the first portion of the substrate. The second portion of the layer of protective material is removed.

20 Claims, 4 Drawing Sheets

(51) Int. Cl.
*H01L 21/3205* (2006.01)
*H01L 27/06* (2006.01)
*H01L 27/11* (2006.01)
*H01L 27/112* (2006.01)
*H01L 29/78* (2006.01)
*H01L 21/8222* (2006.01)
*H01L 21/8238* (2006.01)
*H01L 29/66* (2006.01)
*H01L 21/02* (2006.01)
*H01L 21/28* (2006.01)

(52) U.S. Cl.
CPC ............... *H01L 21/82385* (2013.01); *H01L 21/823864* (2013.01); *H01L 27/0623* (2013.01); *H01L 27/11* (2013.01); *H01L 29/6653* (2013.01); *H01L 29/66234* (2013.01); *H01L 29/66674* (2013.01); *H01L 29/7801* (2013.01); *H01L 27/11206* (2013.01)

(56) References Cited

U.S. PATENT DOCUMENTS

| | | | | |
|---|---|---|---|---|
| 5,314,845 A | * | 5/1994 | Lee | C23C 16/401 257/E21.275 |
| 6,146,925 A | * | 11/2000 | Dennison | H01L 23/5223 257/E23.147 |
| 6,218,235 B1 | * | 4/2001 | Hachisuka | H01L 27/10873 257/E21.654 |
| 6,599,795 B2 | * | 7/2003 | Ogata | 438/241 |
| 6,610,577 B1 | * | 8/2003 | Thomas | H01L 21/28273 257/E21.209 |
| 6,770,927 B2 | * | 8/2004 | Cho | H01L 21/28247 257/296 |
| 8,367,493 B1 | * | 2/2013 | Ngo | H01L 23/291 257/315 |
| 8,716,104 B1 | * | 5/2014 | Zhang | H01L 21/76224 438/424 |
| 2002/0019090 A1 | * | 2/2002 | Ogata | H01L 21/76897 438/239 |
| 2002/0052128 A1 | * | 5/2002 | Yu | H01L 21/02164 438/792 |
| 2002/0123181 A1 | * | 9/2002 | Hachisuka | H01L 21/76834 438/197 |
| 2008/0164531 A1 | * | 7/2008 | Jawarani | H01L 21/76829 257/369 |
| 2009/0174385 A1 | * | 7/2009 | Yen | H02M 1/36 323/288 |
| 2010/0068875 A1 | * | 3/2010 | Yeh | H01L 21/32139 438/587 |
| 2013/0115763 A1 | * | 5/2013 | Takamure | H01L 21/02129 438/513 |

* cited by examiner

METHOD OF MAKING PROTECTIVE LAYER OVER POLYSILICON STRUCTURE

BACKGROUND

In some applications, a logic circuit, static random access memory (SRAM), and one-time-programmable (OTP) memory of an integrated circuit are fabricated on the same substrate. In some applications, when performing a self-aligned silicide (salicide) process to form electrical contacts on the logic or SRAM part, the OTP part of the integrated circuit is protected by a protective layer. The performance of the logic circuit, the SRAM, and the OTP memory is affected by the thickness of the protective layer in the OTP part and residue of materials used to form the protective layer in the SRAM part.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
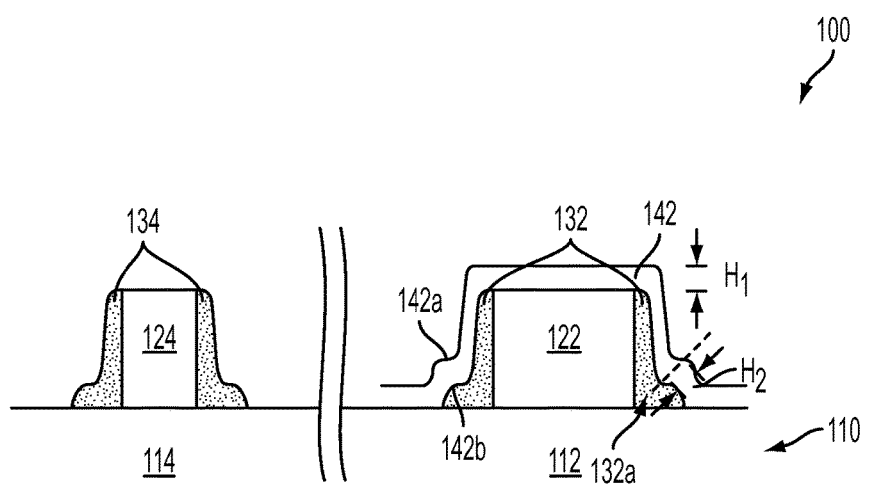
FIG. 1 is a cross-sectional view of an integrated circuit in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

By forming a layer of protective material that is sufficiently thick and yet conformal to a contour of a polysilicon structure and corresponding spacers of an integrated circuit, a process window of a subsequent removal process is enlarged compared to a non-conformal layer of protective material. As a result, the integrated circuit has a better silicide formation in the logic or SRAM part and better leakage prevention in the OTP part. In some embodiments, the disclosed embodiments are suitable to be used in a Bipolar-CMOS-DMOS (BCD) process. Bipolar stands for bipolar junction transistors, CMOS stands for complementary metal-oxide-semiconductor transistors, and DMOS stands for double-diffused metal-oxide-semiconductor transistors.

FIG. 1 is a cross-sectional view of an integrated circuit 100 in accordance with some embodiments. In some embodiments, integrated circuit 100 depicted in FIG. 1 is an intermediate product, which will be further processed by one or more manufacturing processes in order to form a functional integrated circuit. Other active electrical components and passive electrical components of the integrated circuit 100 are not shown in FIG. 1.

Integrated circuit 100 has a substrate 110, a first polysilicon structure 122, a second polysilicon structure 124, a first set of spacers 132, a second set of spacers 134, and a protective layer 142.

In some embodiments, substrate 110 includes: an elementary semiconductor such as silicon or germanium in crystal, polycrystalline, or an amorphous structure; a compound semiconductor including silicon carbide, gallium arsenide, gallium phosphide, gallium nitride, indium phosphide, indium arsenide, and/or indium antimonide; an alloy semiconductor including SiGe, GaAsP, AlInAs, AlGaAs, GaInAs, GaInP, and/or GaInAsP; or combinations thereof. In at least one embodiment, substrate 110 is an alloy semiconductor substrate having a gradient SiGe feature in which the Si and Ge composition change from one ratio at one location to another ratio at another location of the gradient SiGe feature. In another embodiment, the alloy SiGe is formed over a silicon substrate. In yet another embodiment, a SiGe substrate is strained. In some further embodiments, substrate 110 is a semiconductor on insulator. In some examples, substrate 110 includes an epitaxial layer or a buried layer. In other examples, substrate 110 includes a multilayer compound semiconductor structure.

In some embodiments, substrate 110 generally exhibits a conductive characteristic similar to that of an intrinsic semiconductor material or a semiconductor material having a predetermined doping type. In some embodiments, the predetermined doping type is a P-type doping.

Substrate 110 has a first portion 112 and a second portion 114. In some embodiments, two or more of a logic circuit, a static random access memory (SRAM), or a one-time-programmable (OTP) memory are fabricated on substrate 110, where the OTP memory is formed on first portion 112 of substrate 110, and the logic circuit and/or the SRAM are formed on second portion 114 of substrate 110. In some embodiments, the logic circuits, SRAM, and OTP memory are fabricated using a bipolar-CMOS-DMOS (BCD) process. In other words, in some embodiments, at least one bipolar junction transistor (BJT) device, at least one complementary metal-oxide-semiconductor (CMOS) device, and at least one double-diffused metal-oxide-semiconductor (DMOS) device are formed on substrate 110.

First polysilicon structure 122 is over first portion 112 of substrate 110. First set of spacers 132 includes two spacers on opposite sidewalls of first polysilicon structure 122.

Spacers 132 are L-shaped spacers. In some embodiments, spacers 132 have a shape other than an L-shape. In some embodiments, spacers 132 have a material including silicon nitride. In some embodiments, spacers 132 have a multi-layer structure. In some embodiments, integrated circuit 100 has a one-time-programmable (OTP) device that includes first polysilicon structure 122 and spacers 132. In some embodiments, a gate dielectric (not shown) is formed between polysilicon structure 122 and substrate 110. In some embodiments, one or more layers of other materials are formed between polysilicon structure 122 and substrate 110.

Second polysilicon structure 124 is over second portion 114 of substrate 110. Second set of spacers 134 includes two spacers on opposite sidewalls of second polysilicon structure 124. Spacers 134 are L-shaped spacers. In some embodiments, spacers 134 have a shape other than an L-shape. In some embodiments, spacers 134 have a material including silicon nitride. In some embodiments, spacers 134 have a multi-layer structure. In some embodiments, integrated circuit 100 has a logic circuit or an SRAM that includes second polysilicon structure 124 and spacers 134. In some embodiments, a gate dielectric (not shown) is formed between polysilicon structure 124 and substrate 110. In some embodiments, one or more layers of other materials are formed between polysilicon structure 124 and substrate 110.

In some embodiments, first and second polysilicon structure 122 and 124 are concurrently formed and include similar materials. In some embodiments, first and second set of spacers 132 and 134 are concurrently formed and include similar configuration and materials.

Protective layer 142 covers first portion 112 of substrate 110, first polysilicon structure 122, and first set of spacers 132. Protective layer 142 is free from covering second portion 114 of substrate 110, second polysilicon structure 124, and second set of spacers 134. A thickness of protective layer 142 is measurable as a distance between an upper surface 142a and a lower surface 142b of protective layer 142 along a normal direction of the lower surface 142b of protective layer 142. Protective layer 142 having a thickness $H_1$ over first polysilicon structure 122, and the thickness $H_1$ is equal to or greater than 500 Å. In some embodiments, thickness $H_1$ represents the maximum thickness of protective layer 142 directly over first polysilicon structure 122. Protective layer 142 having a thickness $H_2$ over spacers 132, and the thickness $H_2$ is equal to or less than 110% of the first thickness $H_1$. In some embodiments, thickness $H_2$ represents the maximum thickness of protective layer 142 directly over spacers 132. In some embodiments, the maximum thickness of protective layer 142 over spacers 132 occurs at about a corner portion 132a of the spacers 132.

Protective layer 142 thus provides sufficient protection to first polysilicon structure 122 while second polysilicon structure 124 is being processed by a silicide process. Also, the difference between thickness $H_2$ and thickness $H_1$ is small enough (equal to or less than 10% of thickness $H_1$) that eases a requirement for the processing window for a subsequent protective layer removal process.

Figure 2:
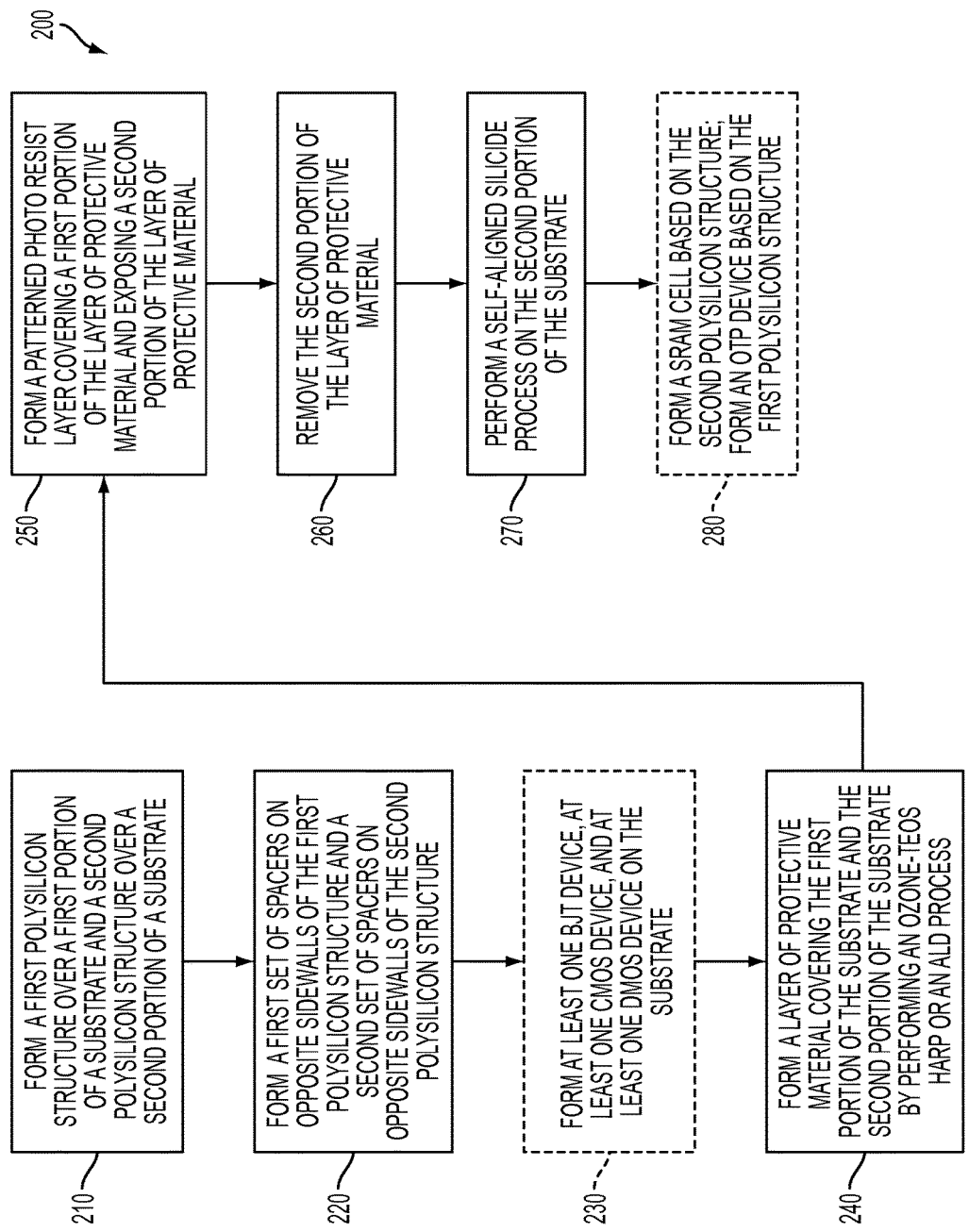
FIG. 2 is a flow chart of a method of fabricating an integrated circuit in accordance with some embodiments.
Figure 3A:
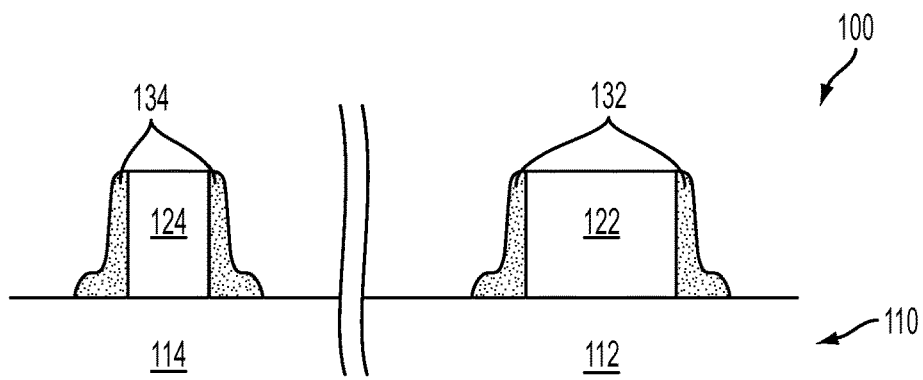
FIGS. 3A to 3C are cross-sectional views of an integrated circuit at various manufacturing stages in accordance with some embodiments.
Figure 3B:
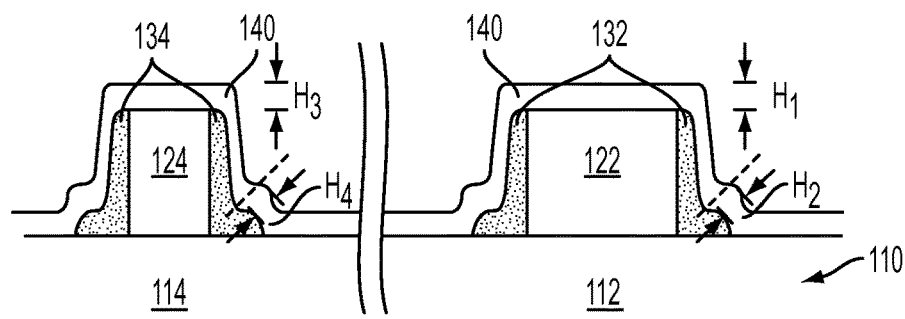
Figure 3C:
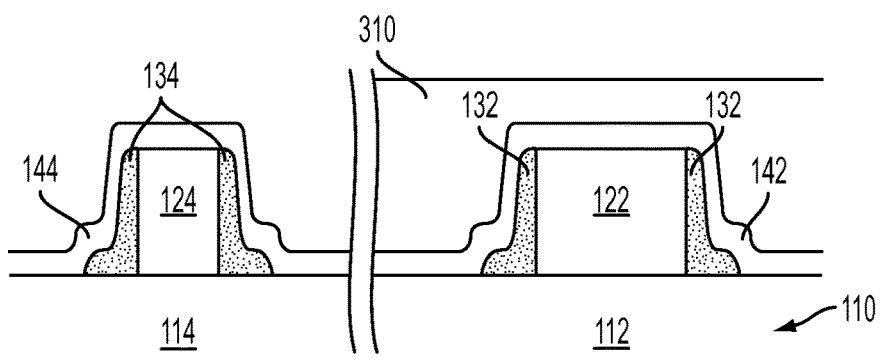

FIG. 2 is a flow chart of a method 200 of fabricating an integrated circuit 100 in accordance with some embodiments. FIGS. 3A to 3C are cross-sectional views of integrated circuit 100 at various manufacturing stages in accordance with some embodiments. Components in FIGS. 2 and 3A to 3C that are the same or similar to those in FIG. 1 are given the same reference numbers, and detailed description thereof is omitted. It is understood that additional operations may be performed before, during, and/or after the method 200 depicted in FIG. 2, and that some other processes may only be briefly described herein.

As depicted in FIG. 2 and FIG. 1, the process 200 begins at operation 210, where first polysilicon structure 122 is formed over first portion 112 of substrate 110 and second polysilicon structure 124 is formed over second portion 114 of substrate 110. In some embodiments, operation 210 includes forming a layer of polysilicon material over substrate 110 and then patterning the layer of polysilicon material into first and second polysilicon structures 122 and 124 by performing a lithographic process followed by a removal process.

The process 200 proceeds to operation 220, where first set of spacers 132 and second set of spacers 134 are formed on sidewalls of polysilicon structure 122 and 124. In some embodiments, operation 220 includes forming a layer of spacer material over first and second polysilicon structures 122 and 124 and substrate 110 and then patterning the layer of spacer material into first and second sets of spacers 132 and 134 by performing a removal process. In some embodiments, the layer of spacer material includes silicon nitride. In some embodiments, the removal process includes an anisotropic etch process.

FIG. 3A is a cross-sectional view of integrated circuit 100 after operation 220.

As depicted in FIG. 2 and FIG. 1, the process 200 proceeds to operation 230, where one or more other electrical components are also formed on substrate 110. In some embodiments, integrated circuit 100 is fabricated by a BCD process, and operation 230, in conjunction with operations 210 and/or 220, are usable to form at least one bipolar junction transistor (BJT), at least one complementary metal-oxide-semiconductor (CMOS) device, and at least one double-diffused metal-oxide-semiconductor (DMOS) device on substrate 110. In some embodiments, operation 230 is performed before, after, or concurrently with operations 210 and 220. In some embodiments, operation 230 is omitted.

The process 200 proceeds to operation 240, where a layer of protective material is formed over substrate 110. In some embodiments, the layer of protective material includes silicon oxide, and operation 240 includes performing an ozone-tetraethyl orthosilicate (TEOS) high aspect ratio process (HARP) or an atomic layer deposition (ALD) process. In some embodiments, the ozone-TEOSHARP process or the ALD process is suitable to form a layer of protective material that is conformal to a contour of polysilicon structure 122 and 124 and corresponding spacers 132 and 134 of an integrated circuit 100, even when the thickness of the layer of protective material over polysilicon structure 122 and 124 is equal to or greater than 500 Å.

FIG. 3B is a cross-sectional view of integrated circuit 100 after operation 240. A layer of protective material 140 covers the first and second polysilicon structures 122 and 132 and first and second sets of spacers 132 and 134.

The layer of protective material 140 has a thickness $H_1$ over first polysilicon structure 122, and the thickness $H_1$ is equal to or greater than 500 Å. In some embodiments, thickness $H_1$ represents the maximum thickness of the layer of protective material 140 over first polysilicon structure 122. The layer of protective material 140 having a thickness $H_2$ over spacers 132, and the thickness $H_2$ is equal to or less than 110% of the first thickness $H_1$. In some embodiments, thickness $H_2$ represents the maximum thickness of the layer of protective material 140 over spacers 132.

Also, the layer of protective material 140 has a maximum thickness $H_3$ over second polysilicon structure 124, and the maximum thickness $H_3$ is equal to or greater than 500 Å. The layer of protective material 140 having a maximum thickness $H_4$ over spacers 134, and the thickness $H_4$ is equal to or less than 110% of the thickness $H_3$. In some embodiments, the difference between thickness $H_4$ and thickness $H_3$ is small enough (e.g., equal to or less than 10% of thickness $H_3$) that eases a requirement for the processing window for one or more subsequent protective layer removal processes.

As depicted in FIG. 2 and FIG. 1, the process 200 proceeds to operation 250, where a patterned photo resist layer is formed over a portion of the layer of protective material 140 and the first portion of substrate 112.

FIG. 3C is a cross-sectional view of integrated circuit 100 after operation 250. A patterned photo resist layer 310 is formed to cover a first portion 142 of the layer of protective material 140 that covers the first portion 112 of the substrate 110 and to expose a second portion 144 of the layer of protective material 140 that covers the second portion 114 of the substrate 110.

As depicted in FIG. 2, FIG. 1, and FIG. 3C, the process 200 proceeds to operation 260, where the second portion 144 of the layer of protective material 140 is removed. In some embodiments, operation 260 includes performing a dry etch process or a wet etch process, or a combination thereof. In some embodiments, operation 260 includes performing a dry etch process and then performing a wet etch process after the performing the dry etch process. After operation 260, patterned photo resist layer 310 is removed by an ashing process.

Because the layer of protective material 140 is conformally formed along a contour of polysilicon structure 124 and spacers 134, the process window for the dry etch process is sufficient large for yield control, and the process window for the wet etch process is sufficient large for protective layer peeling prevention.

FIG. 1 depicts a cross-sectional view of integrated circuit 100 after operation 260.

As depicted in FIG. 2, the process 200 proceeds to operation 270, where a self-aligned silicide (salicide) process is performed on the second portion 114 of the substrate 110 while the first portion 112 of the substrate 110 is covered by the first portion 142 of the layer of protective material. The process 200 then proceeds to operation 280, where a logic circuit or an SRAM cell is formed based on the second polysilicon structure 124 and spacers 134, and an OTP device is formed based on first polysilicon structure 122 and spacers 132. In some embodiments, operation 280 is omitted, and polysilicon structures 122 and 124 are used to form other types of electrical components.

Figure 4:
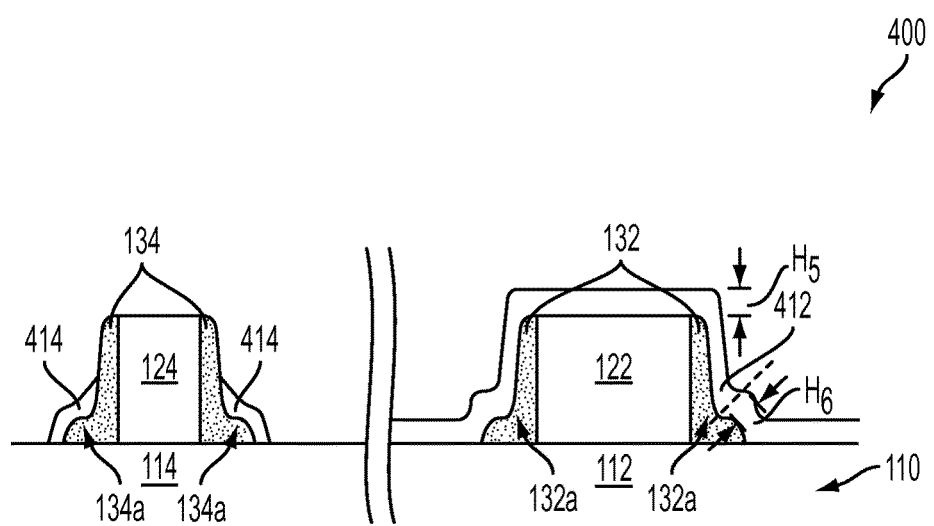
FIG. 4 is a cross-sectional view of an integrated circuit that is fabricated by a process different from that depicted in FIG. 2 in accordance with some embodiments.

FIG. 4 is a cross-sectional view of an integrated circuit 400 that is fabricated by a process different from that depicted in FIG. 2 in accordance with some embodiments. Components in FIG. 4 that are the same or similar to those in FIG. 1 are given the same reference numbers, and detailed description thereof is omitted.

Integrated circuit 400 includes a protective layer 412 over first polysilicon structure 122, first set of spacers 132, and first portion 112 of substrate 110. Integrated circuit 400 further includes residue protective materials 414 near the corner portion 134a of second set of spacers 134 of and extending to an upper surface of second portion 114 of substrate 110.

Compared with integrated circuit 100, a processing operation comparable to operation 240 for manufacturing integrated circuit 400 is performed by a Plasma-enhanced chemical vapor deposition (PECVD) process. The PECVD process causes accumulation of protective materials at corner portions 132a and 134a. As a result, when a thickness $H_5$ of protective layer 412 over first polysilicon structure 122 is equal to or greater than 500 Å, a thickness $H_6$ of protective layer 412 around corner portion 132a of first set of spacers 132 is greater than 110% of thickness $H_5$. In some embodiments, thickness $H_6$ of protective layer 412 is greater than 120% of thickness $H_5$.

At a stage comparable to FIG. 3C, second polysilicon structure 122 of integrated circuit 400 is covered by a layer of protective material in a manner similar to protective layer 412 over first silicon structure 122. The difference between thickness $H_6$ and thickness $H_5$ is too large (greater than 10% of thickness $H_5$) that renders a requirement for the processing window for a subsequent protective layer removal process more stringent than that of operation 260 or technically infeasible. As a result, residue protective materials 414 near the corner portion 134a of second set of spacers 134 are not fully removed.

In some embodiments, residue protective materials 414 hinder a subsequent salicidation process comparable to operation 270. In some embodiments, in order to reduce or eliminate residue protective materials 414, protective layer 412 becomes too thin to effectively protect polysilicon structure 122 from the subsequent salicidation process intended for polysilicon structure 124 and/or second portion of substrate 114.

In accordance with one embodiment, a method includes forming a first polysilicon structure over a first portion of a substrate. A second polysilicon structure is formed over a second portion of the substrate. Two spacers are formed on opposite sidewalls of the second polysilicon structure. A layer of protective material is formed to cover the first portion of the substrate, the first polysilicon structure, the second portion of the substrate, the second polysilicon structure, and the two spacers. The layer of protective material has a first maximum thickness over the second polysilicon structure and a second maximum thickness over the two spacers. The first maximum thickness is equal to or greater than 500 Å, and the second maximum thickness is equal to or less than 110% of the first maximum thickness. A patterned photo resist layer is formed to cover a first portion of the layer of protective material that covers the first portion of the substrate and to expose a second portion of the layer of protective material that covers the second portion of the substrate. The second portion of the layer of protective material is removed.

In accordance with another embodiment, a method includes forming a first polysilicon structure over a first portion of a substrate and a second polysilicon structure over a second portion of the substrate. A first set of spacers is formed on opposite sidewalls of the first polysilicon structure, and a second set of spacers is formed on opposite sidewalls of the second polysilicon structure. A layer of silicon oxide is formed to cover the first portion of the substrate, the first polysilicon structure, and the first set of spacers, the second portion of the substrate, the second polysilicon structure, and the second set of spacers. The layer of protective material has a thickness over the first polysilicon structure. The thickness is equal to or greater than 500 Å. The forming the layer of protective material includes performing an ozone- tetraethyl orthosilicate (TEOS) high aspect ratio process (HARP) or an atomic layer deposition (ALD) process. A patterned photo resist layer is formed to cover a first portion of the layer of protective material that covers the first portion of the substrate and to expose a second portion of the layer of protective material that covers the second portion of the substrate. The second portion of the layer of protective material is removed.

In accordance with another embodiment, a manufacture includes a substrate, a first polysilicon structure, a second polysilicon structure, two spacers, and a protective layer. The substrate has a first portion and a second portion. The first polysilicon structure is over the first portion of the substrate. The second polysilicon structure is over the second portion of the substrate. The two spacers are on opposite sidewalls of the second polysilicon structure. The protective layer covers the first portion of the substrate and the first polysilicon structure. The protective layer is free from covering the second portion of the substrate, the second polysilicon structure, and the two spacers. The protective layer has a first maximum thickness over the first polysilicon structure, and the first maximum thickness is equal to or greater than 500 Å.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a first polysilicon structure over a first portion of a substrate;
   forming a second polysilicon structure over a second portion of the substrate;
   forming first spacers on opposite sidewalls of the first polysilicon structure and second spacers on opposite sides of the second polysilicon structure, the forming comprising:
      depositing a layer of spacer material directly over the first portion of the substrate and the second portion of the substrate, wherein the layer of spacer material overlies the first polysilicon structure and the second polysilicon structure; and
      removing portions of the layer of spacer material to expose an upper surface of the first polysilicon structure, the second polysilicon structure and upper surfaces of the first portion of the substrate and the second portion of the substrate, the removing forming the first spacers and the second spacers, each of the first spacers and the second spacers has a vertically tapered profile and a concave corner region;
   forming a layer of protective material directly covering the first portion of the substrate, the first polysilicon structure, and the first spacers, the layer of protective material having a first maximum thickness over the polysilicon structure and a second maximum thickness over the first spacers, the first maximum thickness, directly over the upper surface of the first polysilicon structure, being equal to or greater than 500 Å, and the second maximum thickness, directly over each first spacer, being at least 100% but not more than 110% of the first maximum thickness;
   performing a silicide process on the second polysilicon structure.

2. The method of claim 1, wherein the layer of protective material comprises silicon oxide, and the forming the layer of protective material comprises performing an ozone-tetraethyl orthosilicate (TEOS) high aspect ratio process (HARP) or an atomic layer deposition (ALD) process.

3. The method of claim 1, further comprising:
   forming at least one bipolar junction transistor (BJT) device on the substrate;
   forming at least one complementary metal-oxide-semiconductor (CMOS) device on the substrate; and
   forming at least one double-diffused metal-oxide-semiconductor (DMOS) device on the substrate; wherein each of the at least one, BJT device, CMOS device and DMOS device are formed on the first portion of the substrate.

4. The method of claim 1, further comprising:
   protecting a first portion of the layer of protective material covering the first polysilicon structure; and
   removing a second portion of the layer of protective material to expose an upper surface of the second polysilicon structure; wherein the removing the second portion of the layer of protective material comprises:
   performing a dry etch process; and
   performing a wet etch process after performing the dry etch process.

5. The method of claim 1, further comprising:
   protecting a first portion of the layer of protective material covering the first polysilicon structure;
   removing a second portion of the layer of protective material to expose an upper surface of the second polysilicon structure; and
   performing a self-aligned silicide process on the second portion of the substrate while the first portion of the substrate is covered by the first portion of the layer of protective material.

6. The method of claim 1, further comprising:
   using the second polysilicon structure and the two spacers adjacent thereto to form a static random access memory (SRAM) cell.

7. The method of claim 1, further comprising:
   using the first polysilicon structure to form a one-time-programmable (OTP) device.

8. A method, comprising:
   forming a first polysilicon structure over a first portion of a substrate and a second polysilicon structure over a second portion of the substrate;
   depositing a spacer material directly on the first polysilicon structure and the second polysilicon structure to form a first set of spacers on opposite sidewalls of the first polysilicon structure and a second set of spacers on opposite sidewalls of the second polysilicon structure, wherein after the depositing, spacer material is removed from an upper surface of the first polysilicon structure and an upper surface of the second polysilicon structure, each of the first set of spacers and the second set of spacers has a vertically tapered profile and a concave corner region between an upper portion and a lower portion of each spacer;
   forming a layer of silicon oxide directly on and covering the first portion of the substrate, the first polysilicon structure, the first set of spacers, the second portion of the substrate, the second polysilicon structure, and the second set of spacers, the layer of silicon oxide having a first thickness directly over the upper surface of the first polysilicon structure equal to or greater than 500 Å, and a second thickness directly over each spacer of the first set of spacers at least 100% but not more than 110% of the first thickness, the forming of the layer of silicon oxide comprises performing an ozone-tetraethyl orthosilicate (TEOS) high aspect ratio process (HARP) or an atomic layer deposition (ALD) process;

forming a photoresist layer covering a first portion of the layer of silicon oxide that covers the first portion of the substrate and a second portion of the layer of silicon oxide that covers the second portion of the substrate;

patterning the layer of photoresist to expose the second portion of the layer of silicon dioxide; and removing the second portion of the layer of silicon oxide.

9. The method of claim 8, further comprising:
forming at least one bipolar junction transistor (BJT) device on the first portion of the substrate;
forming at least one complementary metal-oxide-semiconductor (CMOS) device on the first portion of the substrate; and
forming at least one double-diffused metal-oxide-semiconductor (DMOS) device on the first portion of the substrate.

10. The method of claim 8, further comprising:
after removing the second portion of the layer of silicon oxide, performing a self-aligned silicide process on the second portion of the substrate.

11. The method of claim 8, further comprising:
using the second polysilicon structure and the two spacers adjacent thereto to form a static random access memory (SRAM) cell.

12. The method of claim 8, further comprising:
using the first polysilicon structure to form a one-time-programmable (OTP) device.

13. The method of claim 8, wherein the removing the second portion of the layer of silicon oxide comprises:
performing a dry etch process; and
performing a wet etch process after performing the dry etch process.

14. The method of claim 8, further comprising:
performing an ashing process to remove the patterned photo resist layer.

15. A method, comprising:
forming a first polysilicon structure over a first portion of a substrate and a second polysilicon structure over a second portion of the substrate;
depositing a spacer material directly over the second polysilicon structure to form spacers on opposite sidewalls thereof, wherein after the depositing, the spacer material is removed from an upper surface of the second polysilicon structure, the spacers having a vertically tapered profile and a concave corner region between a narrow portion and a wide portion of each spacer;
depositing a conformal layer of silicon oxide directly covering the first portion of the substrate, the first polysilicon structure, the second portion of the substrate, the second polysilicon structure, and the set of spacers, such that the conformal layer of silicon oxide has a first maximum thickness directly over the second polysilicon structure and a second maximum thickness directly over the set of spacers, the first maximum thickness being equal to or greater than 500 Å, and the second maximum thickness being at least 100% but not more than 110% of the first maximum thickness;
forming a patterned photo resist layer covering a first portion of the conformal layer of silicon oxide that covers the first portion of the substrate and exposing a second portion of the layer of silicon oxide that covers the second portion of the substrate;
removing the second portion of the layer of silicon oxide; and
performing a salicide process on the second portion of the substrate.

16. The method of claim 15, wherein the forming the layer of silicon oxide comprises performing an ozone-tetraethyl orthosilicate (TEOS) high aspect ratio process (HARP) or an atomic layer deposition (ALD) process.

17. The method of claim 15, further comprising:
removing the patterned photo resist layer by an ashing process.

18. The method of claim 15, wherein the removing the second portion of the layer of silicon oxide comprises:
performing a dry etch process; and
performing a wet etch process after performing the dry etch process.

19. The method of claim 15, further comprising:
using the first polysilicon structure to form a one-time-programmable (OTP) device.

20. The method of claim 8, wherein the depositing a spacer material comprises depositing a plurality of layers of spacer material to form a spacer.

* * * * *